United States Patent
Baumgartl et al.

(10) Patent No.: US 8,324,896 B2
(45) Date of Patent: Dec. 4, 2012

(54) PREALLOCATABLE TRANSMISSION DATA MEMORY ELEMENT OF AN MR TRANSMISSION UNIT IN ARRAY APPLICATIONS

(75) Inventors: Rudi Baumgartl, Erlangen (DE); Nikolaus Demharter, Dormitz (DE); Philipp Hoecht, Newton (DE); Wilfried Schnell, Forchheim (DE)

(73) Assignee: Siemens Aktiengesellschaft, Munich (DE)

( * ) Notice: Subject to any disclaimer, the term of this patent is extended or adjusted under 35 U.S.C. 154(b) by 279 days.

(21) Appl. No.: 12/862,944

(22) Filed: Aug. 25, 2010

(65) Prior Publication Data

US 2011/0050224 A1    Mar. 3, 2011

(30) Foreign Application Priority Data

Aug. 25, 2009  (DE) .................. 10 2009 038 784

(51) Int. Cl.
*G01V 3/00*  (2006.01)
(52) U.S. Cl. ......... 324/307; 324/300; 324/309; 324/310
(58) Field of Classification Search .................. None
See application file for complete search history.

(56) References Cited

U.S. PATENT DOCUMENTS

| 6,969,992 | B2 * | 11/2005 | Vaughan et al. | 324/318 |
| 7,477,057 | B2 | 1/2009 | Baumgartl et al. | |
| 8,224,609 | B2 * | 7/2012 | Griswold et al. | 702/106 |

FOREIGN PATENT DOCUMENTS

DE           199 22 221 A1    11/2000
DE      10 2004 055 934 A1     6/2006

* cited by examiner

*Primary Examiner* — Melissa Koval
*Assistant Examiner* — Trung Nguyen
(74) *Attorney, Agent, or Firm* — Schiff Hardin LLP

(57) ABSTRACT

Optimized transmission system for an MRT is achieved by a device and a method to generate transmission signals (29) via multiple transmission units of a transmission system for a magnetic resonance tomography system, wherein transmission data are respectively received from the transmission units via a transmission data input, received transmission data are stored in transmission data memory elements of the transmission units, transmission signals representing stored transmission data are generated with transmission data (stored in transmission data memory elements) by transmission signal transmission units of the transmission units, and the generation of transmission signals proceeds simultaneously via the transmission signal transmission units.

26 Claims, 2 Drawing Sheets

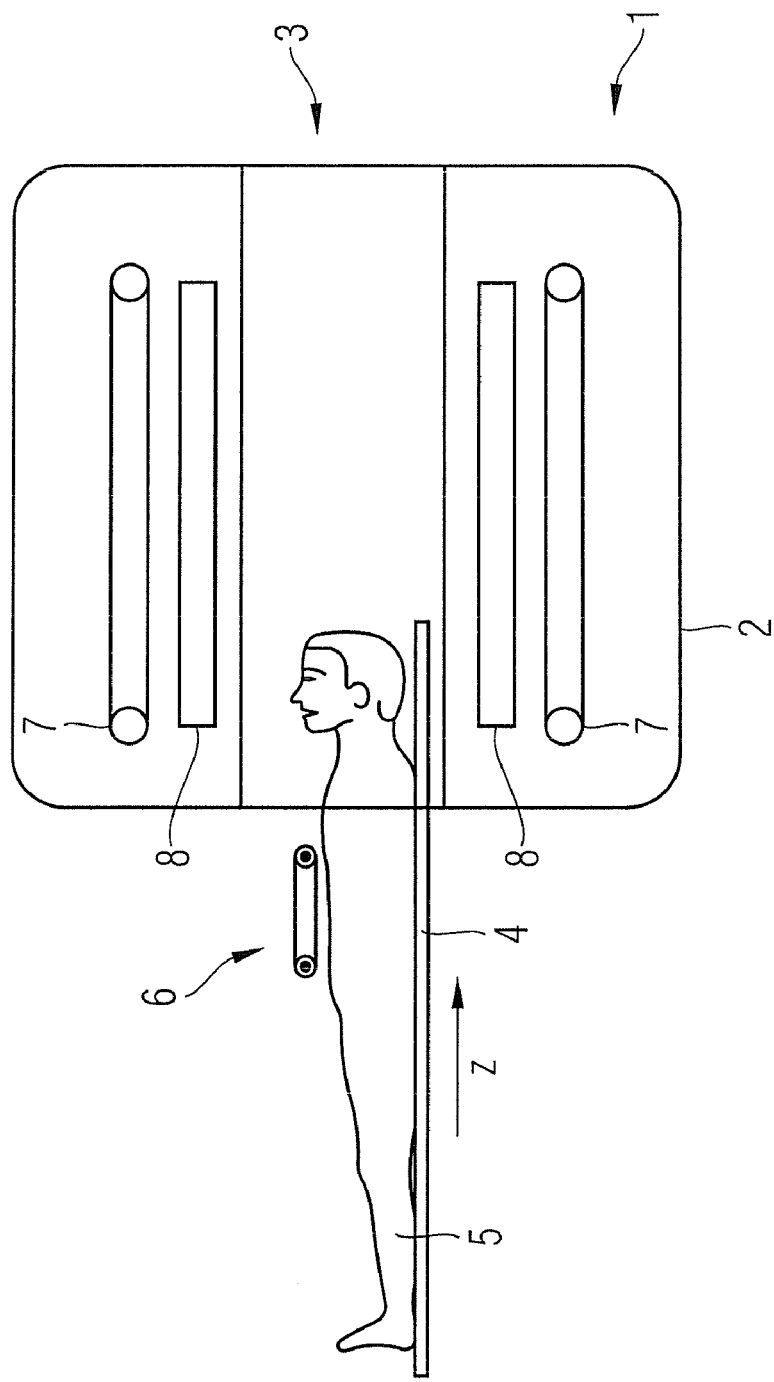

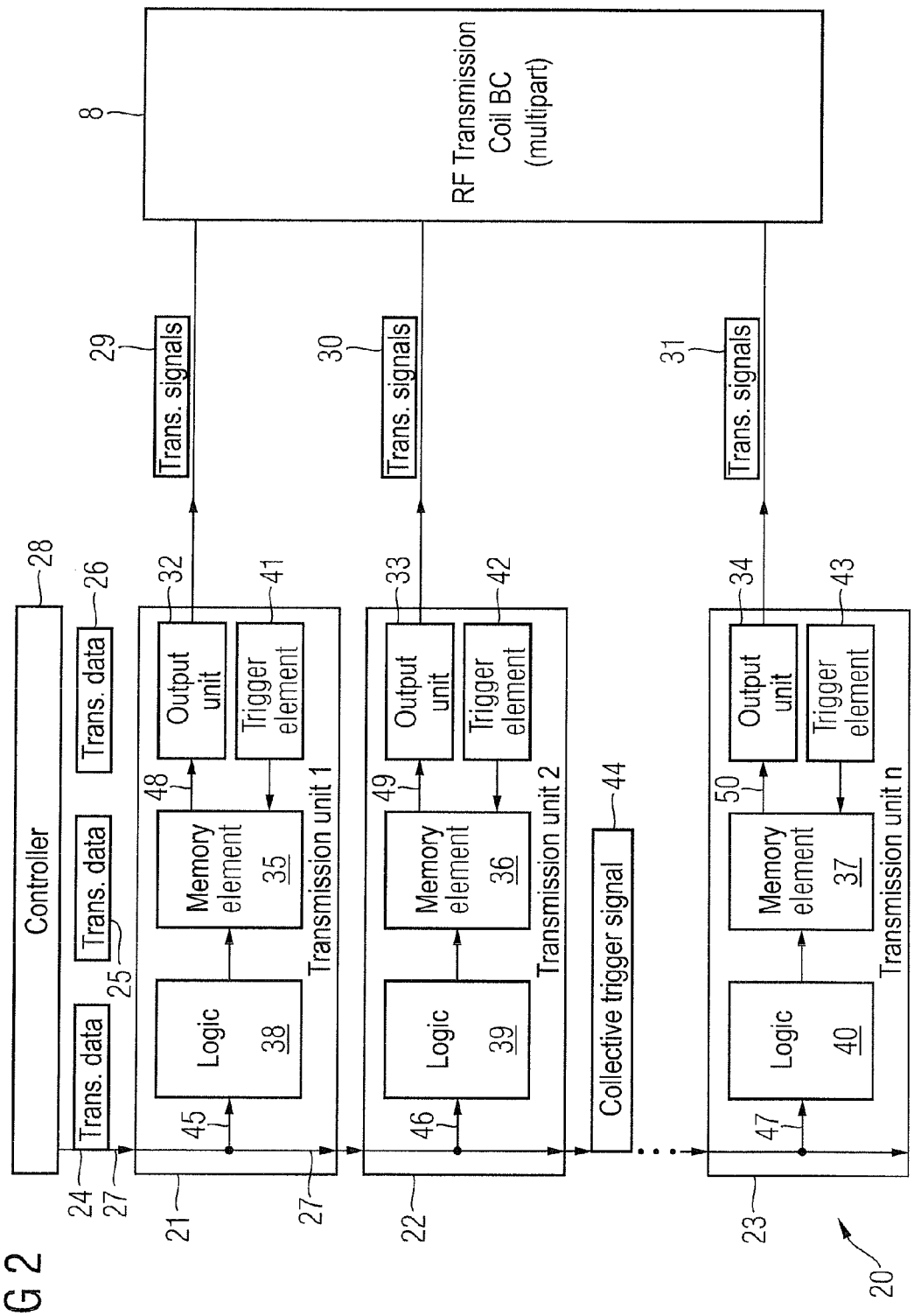

PREALLOCATABLE TRANSMISSION DATA MEMORY ELEMENT OF AN MR TRANSMISSION UNIT IN ARRAY APPLICATIONS

BACKGROUND OF THE INVENTION

1. Field of the Invention

The present invention concerns methods and devices to generate transmission signals via multiple transmission units of a transmission system for a magnetic resonance tomography system.

2. Description of the Prior Art

Magnetic resonance (MR) apparatuses, in particular for the examination of patients by magnetic resonance tomography, are known from DE10314215B4, for example.

Modern magnetic resonance (also called MR or MRT) systems operate with coils to transmit radio-frequency pulses for nuclear magnetic resonance excitation and/or to receive induced magnetic resonance signals. A magnetic resonance system typically has a permanent magnet or a superconducting coil that generates an optimally homogeneous magnetic field—known as a basic magnetic field ($B_0$)—in an examination region. A whole-body coil (also called a body coil or BC) is permanently installed in the MR apparatus, and multiple small local coils (also called surface coils or LCs are available for placement on or around the patient). Image data from selected regions of the subject or patient to be examined are obtained with gradient coils for three spatial axes, from which images of a patient can be generated. Spatial coding in magnetic resonance tomography is typically achieved with a gradient coil system with three independently controllable, magnetically orthogonal gradient field coils. The orientation of the coding plane ("gradient field") can be freely selected by superimposing the three freely scalable fields (in three directions X, Y, Z).

In order to radiate the desired shapes (for example the time curves of RF transmission signals) in a transmission array for MR systems—thus to transmit or to induce the transmission—the individual transmission units must be supplied with the corresponding transmission data that define the shapes. These data are transferred to the transmission units via respective data paths from one or more control units.

For example, it is known to use a parallel structure that provides a separate data path on which the data can be transferred in real time (U.S. Pat. No. 6,969,992) for each unit.

SUMMARY OF THE INVENTION

An object of the present invention is to provide an optimized transmission system for MRT.

According to the invention, this object is achieved by a method to generate transmission signals via multiple transmission units of a transmission system for a magnetic resonance tomography system, wherein transmission data are respectively received from the transmission units via a transmission data input, the received transmission data are stored in transmission data memory elements of the transmission units, transmission signals representing stored transmission data are generated with transmission data stored in transmission data memory elements by transmission signal transmission units of the transmission units, and the generation of transmission signals runs simultaneously through the transmission signal transmission units.

The above object also is achieved according to the invention by a transmission system with multiple transmission units for a magnetic resonance tomography system, wherein each transmission unit has a transmission data input for transmission data, and having a transmission signal transmission unit to generate transmission signals that can be generated under consideration of the transmission data, and a transmission data memory element to store transmission data input via the transmission data input, and wherein a connection between a transmission data memory element and a transmission signal transmission unit is provided to transfer stored transmission data to the transmission signal transmission unit, and wherein a trigger element is provided to induce a time-synchronized (in particular simultaneous) generation of transmission signals by the transmission signal transmission units of the transmission units.

Through caching, the invention enables a resource-sparing transmission of transmission data to transmission units of a magnetic resonance tomography system.

In particular, the use of a transmission data bus to which all transmission units are connected allows all units to be successively supplied with data. This simplifies the system design and can optimize the costs.

An expansion with additional transmission units is advantageously possible, such that the system is adaptive.

Every transmission unit appropriately contains a transmission data memory element that is preallocated with the transmission data at an arbitrary suitable point in time. After triggering by a trigger element, the transmission unit generates a desired transmission signal by means of the output unit (resonator).

According to one embodiment of the invention, in each transmission unit a trigger element in the form of a timer (synchronized with other timers) induces a time-synchronized generation of transmission signals via the transmission signal transmission units of the transmission units.

According to a further embodiment of the invention, each transmission unit has a trigger input for a collective trigger signal sent to all the transmission units, each a transmission unit being caused by the collective trigger signal sent to the transmission units to generate a transmission signal by their transmission signal transmission units at a point in time, this point in time being time-synchronized with respect to the generation of transmission signals by the transmission signal transmission units of additional transmission units.

The transmission signal transmission units are also called output units in the following.

BRIEF DESCRIPTION OF THE DRAWINGS

FIG. 1 is a schematically simplified representation of a magnetic resonance apparatus, FIG. 2 illustrates, in a schematically simplified presentation, a transmission system according to the invention with multiple transmission units for a magnetic resonance tomography system.

DESCRIPTION OF THE PREFERRED EMBODIMENTS

FIG. 1 shows a magnetic resonance apparatus 1 with a whole-body coil 2 and a tube-shape chamber 3 into which a patient bed 4 (for example with a patient 5 and a local coil 6) can be moved in the direction z in order to generate MRT exposures of the patient 5, wherein a few gradient coils 7 are also used in a known manner.

FIG. 2 schematically shows a transmission system 20 according to the invention (for example a transmission array) with multiple transmission units 21, 22, 23 for a magnetic resonance tomography system.

Multiple transmission units 21, 22, 23 (with the labeling transmission unit 1, transmission unit 2, . . . , transmission unit n) of a transmission system 20 (for example a whole-body coil or local coil or gradient coil of an MRT) of an MRT 1 should respectively generate predetermined transmission signals 24, 25, 26 (and, for example, also output the signals 24, 25, 26 or allow their output from a known, typical transmitter). The elements of the transmission units 21, 22, 23 are controlled by a transmission unit controller 38, 39, 40 (designated as "Logic" in FIG. 2).

Instead of sending transmission data 24, 25, 26 defining these transmission signals 29, 30, 31 via a broadband bus, here transmission data 24, 25, 26 are transmitted from a controller 28 of the transmission system 20 to the transmission units 21, 22, 23 at an arbitrary point in time (before the transmission of transmission signals to a patient or a subject)—for example via a common bus 27—and are stored there, and transmission signals 29, 30, 31 are generated (simultaneously) in the transmission units 21, 22, 23 (for example are generated and/or radiated to the subject or the patient as RF signals) only when an examination of a subject or patient should ensue (by means of the transmission signals).

The transmission units 21, 22, 23 receive transmission data 24, 25, 26 from a control unit 28 (designated as a controller in FIG. 2) via a common transmission data bus 27. Using the transmission data 24, 25, 26, transmission signal transmission units 32, 33, 34 (respectively designated in FIG. 2 with the typical designation of "output unit") respectively generate transmission signals 29, 30, 31 that are radiated as radio-frequency signals to a subject or patient in an MRT (for example known RF pulses or gradient signals etc.).

A transmission data memory element 35, 36, 37 (designated as a memory element in FIG. 2) in each of the transmission units 21, 22, 23 stores transmission data 24, 25, 26 input via a transmission data input 45, 46, 47 (from bus 27 via a transmission unit controller 38, 39, 40).

Transmission data 24, 25, 26 respectively stored in the transmission data memory elements 35, 36, 37 are provided to the respective transmission signal transmission units 32, 33, 34, and transmission signals 29, 30, 31 are generated from the transmission data by the respective transmission signal transmission units 32, 33, 34.

The generation of transmission signals 29, 30, 31 is initiated here synchronously via the transmission signal transmission units 32, 33, 34 by, upon a collective trigger signal 44 of a central controller 28 or upon a triggering by trigger elements 41, 42, 42 (in the form of synchronized timers, for example) in the transmission units 21, 22, 23, transmission data 24, 25, 26 stored in a transmission data memory element 35, 36, 37 being provided to the respective transmission signal transmission unit 32, 33, 34, and respective transmission signals 29, 30, 31 being generated from the transmission data by the respective transmission signal transmission unit 32, 33, 34.

Although modifications and changes may be suggested by those skilled in the art, it is the intention of the inventor to embody within the patent warranted hereon all changes and modifications as reasonably and properly come within the scope of his contribution to the art.

We claim as our invention:

1. A method to generate transmission signals that cause a radio frequency (RF) radiator to excite nuclear spins in a subject in a magnetic resonance tomography system, comprising the steps of:
   supplying respective transmission data to respective transmission units via respective data inputs of the respective transmission units;
   at each transmission unit, upon receipt of the transmission data, storing the received transmission data in a memory element at the transmission unit that received the transmission data, each transmission unit also comprising a transmission signal generator having access to the memory element at that transmission unit;
   synchronously initiating generation of respective transmission signals by the respective transmission signal generators by synchronously causing the respective signal transmission generators to retrieve the transmission data stored in the memory element accessible by that transmission signal generator and to generate the respective transmission signals from the respective retrieved transmission data; and
   making said respective transmission signals available at respective outputs of said transmission units in a form that cause radiation of RF energy.

2. A method as claimed in claim 1 wherein each transmission unit comprises a trigger element in communication with the memory element at that transmission unit, and comprising synchronously initiating the generation of the respective trigger signals by synchronized operation of the respective trigger elements to cause the respective memory elements in communication therewith to provide the transmission data stored therein to the respective transmission signal generator having access to that memory element.

3. A method a claimed in claim 2 wherein each of said trigger element comprises a timer, and comprising synchronously initiating generation of the respective transmission signals by respectively initiating generation of the respective transmission signal at each transmission unit at a time indicated by the timer at that transmission unit.

4. A method a claimed in claim 1 wherein each of said transmission unit comprises a trigger input, and comprising synchronously initiating generation of the respective transmission signals by supplying a collective trigger signal from a controller to each of the trigger inputs at a point in time that is synchronized with the respective generation of the transmission signals in the respective transmission units.

5. A method as claimed in claim 1 comprising supplying the respective transmission data to the respective transmission units from a controller connected to the respective data inputs of the respective transmission units.

6. A method as claimed in claim 5 comprising connecting the respective data inputs of the transmission units to said controller via a transmission data bus via which said transmission data are transmitted to the respective transmission data inputs.

7. A method as claimed in claim 6 comprising providing said transmission data bus with open data ports at which additional transmission units can be subsequently connected.

8. A method as claimed in claim 6 comprising transmitting said transmission data in a sequence via said data bus by transmitting transmission data via said data bus to one of said transmission units before transmitting transmission data via said data bus to another of said transmission units.

9. A method as claimed in claim 1 comprising transmitting transmission data that specify a time curve or shape of the respective transmission signals.

10. A method as claimed in claim 1 comprising generating said transmission signals as a current that causes a resonator to radiate said RF energy.

11. A method as claimed as in claim 1 wherein said transmission signal generators are output units of the respective transmission units.

12. A method as claimed in claim 1 comprising transmitting said transmission data to the respective data inputs of the respective transmission units at a time prior to a time at which said RF energy is to be radiated.

13. A transmission system to generate transmission signals that cause a radio frequency (RF) radiator to excite nuclear spins in a subject in a magnetic resonance tomography system, comprising:
 a plurality of transmission units to which transmission data are supplied via respective data inputs of the respective transmission units;
 a memory element at each transmission unit in which, upon receipt of the transmission data, the received transmission data is stored, each transmission unit also comprising a transmission signal generator having access to the memory element at that transmission unit;
 said transmission signal generators being configured to synchronously initiate generation of respective transmission signals by the respective signal transmission generators synchronously retrieving the transmission data stored in the respective memory element accessible by that transmission signal generator and to generate the respective transmission signals from the respective retrieved transmission data; and
 each transmission unit having an output at which said respective transmission signals are available in a form that cause radiation of RF energy.

14. A transmission system as claimed in claim 13 wherein each transmission unit comprises a trigger element in communication with the memory element at that transmission unit, and wherein the generation of the respective trigger signals is synchronously initiated by synchronized operation of the respective trigger elements to cause the respective memory elements in communication therewith to provide the transmission data stored therein to the respective transmission signal generator having access to that memory element.

15. A transmission system a claimed in claim 14 wherein each of said trigger element comprises a timer, and wherein the generation of the respective transmission signals is synchronously initiated by respectively initiating generation of the respective transmission signal at each transmission unit at a time indicated by the timer at that transmission unit.

16. A transmission system a claimed in claim 13 wherein each of said transmission unit comprises a trigger input, and wherein the generation of the respective transmission signals is synchronously initiated by supplying a collective trigger signal from a controller to each of the trigger inputs at a point in time that is synchronized with the respective generation of the transmission signals in the respective transmission units.

17. A transmission system as claimed in claim 13 comprising a controller connected to the respective data inputs of the respective transmission units that supplies the respective transmission data to the respective transmission units.

18. A transmission system as claimed in claim 17 comprising a transmission data bus that connects the respective data inputs of the transmission units to said controller, via which said transmission data are transmitted to the respective transmission data inputs.

19. A transmission system as claimed in claim 18 wherein said transmission data bus comprises open data ports at which additional transmission units can be subsequently connected.

20. A transmission system as claimed in claim 18 wherein said controller is configured to transmit said transmission data in a sequence via said data bus by transmitting transmission data via said data bus to one of said transmission units before transmitting transmission data via said data bus to another of said transmission units.

21. A transmission system as claimed in claim 13 wherein said transmission data specify a time curve or shape of the respective transmission signals.

22. A transmission system as claimed in claim 13 wherein said transmission units generate said transmission signals as a current that causes a resonator to radiate said RF energy.

23. A transmission system as claimed as in claim 13 wherein said transmission signal generators are output units of the respective transmission units.

24. A transmission system as claimed in claim 13 wherein said transmission data are received at the respective data inputs of the respective transmission units at a time prior to a time at which said RF energy is to be radiated.

25. A magnetic resonance tomography system comprising:
 a magnetic resonance data acquisition unit comprising a radio frequency (RF) resonator that emits radio frequency energy to excite nuclear spins in a subject in the data acquisition unit; and
 a transmission device comprising a plurality of transmission units to which transmission data are supplied via respective data inputs of the respective transmission units, a memory element at each transmission unit in which, upon receipt of the transmission data, the received transmission data is stored, each transmission unit also comprising a transmission signal generator having access to the memory element at that transmission unit, said transmission signal generators being configured to synchronously initiate generation of respective transmission signals by the respective transmission signal generators by synchronously retrieving the transmission data stored in the memory element accessible by that transmission signal generator and to generate the respective transmission signals from the respective retrieved transmission data, and to provide said respective transmission signals available at respective outputs of said transmission units to said RF resonator in a form that cause said radiation of RF energy at said RF resonator.

26. A magnetic resonance tomography system as claimed in claim 25 wherein said transmission data are received at the respective data inputs of the respective transmission units at a time prior to a time at which said RF energy is to be radiated.

* * * * *